United States Patent
Kuroda et al.

(10) Patent No.: US 8,395,315 B2
(45) Date of Patent: Mar. 12, 2013

(54) SUBSTRATE AND ORGANIC EL LIGHT-EMITTING APPARATUS

(75) Inventors: Toshiya Kuroda, Tsukuba (JP); Kazuhito Watanabe, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 13/203,084

(22) PCT Filed: Feb. 23, 2010

(86) PCT No.: PCT/JP2010/053189
§ 371 (c)(1),
(2), (4) Date: Nov. 8, 2011

(87) PCT Pub. No.: WO2010/098480
PCT Pub. Date: Sep. 2, 2010

(65) Prior Publication Data
US 2012/0043881 A1    Feb. 23, 2012

(30) Foreign Application Priority Data

Feb. 24, 2009  (JP) ................................. 2009-040304
Feb. 24, 2009  (JP) ................................. 2009-040305

(51) Int. Cl.
*H01J 1/62* (2006.01)
*H01J 63/04* (2006.01)
(52) U.S. Cl. ......... 313/504; 313/498; 313/112; 313/506
(58) Field of Classification Search .......... 313/498–512, 313/112, 113
See application file for complete search history.

(56) References Cited

U.S. PATENT DOCUMENTS

| 2002/0180909 A1* | 12/2002 | Lubart et al. ............ 349/113 |
| 2004/0263061 A1* | 12/2004 | Ishikawa et al. ......... 313/501 |
| 2006/0049749 A1* | 3/2006 | Ishikawa et al. ......... 313/504 |
| 2007/0176195 A1 | 8/2007 | Kuiseko et al. |
| 2008/0180026 A1* | 7/2008 | Kondo et al. ............ 313/506 |

(Continued)

FOREIGN PATENT DOCUMENTS

| JP | 61-156691 A | 7/1986 |
| JP | 9-129375 A | 5/1997 |

(Continued)

OTHER PUBLICATIONS

Machine-generated English translation of Japanese Patent Application No. 2007-234578, published Sep. 13, 2007.

(Continued)

*Primary Examiner* — Anh Mai
*Assistant Examiner* — Kevin Quarterman
(74) *Attorney, Agent, or Firm* — Sughrue Mion, PLLC

(57) ABSTRACT

An objective of the present invention is to provide a substrate that can achieve high light extraction efficiency, and to provide an organic EL light-emitting apparatus with high light-emitting efficiency by using such a substrate. The present invention is a substrate (1) comprising a transparent substrate (10) and a light-concentrating structural body layer (30), wherein the light-concentrating structural body layer (30) includes a plurality of structural bodies (25) having a conic shape or a hemispherical shape, with the bottom faces of the plurality of structural bodies (25) having a conic shape or a hemispherical shape being located on the same plane. The structural body (25) is preferably a structural body having a cone shape, a square pyramid shape or a triangular pyramid shape.

12 Claims, 4 Drawing Sheets

U.S. PATENT DOCUMENTS

2008/0304155 A1* 12/2008 Endoh et al. .................. 359/558
2009/0230841 A1 9/2009 Boerner

FOREIGN PATENT DOCUMENTS

| | | |
|---|---|---|
| JP | 2007-234578 A | 9/2007 |
| JP | 2008-523546 A | 7/2008 |
| JP | 2009-025427 A | 2/2009 |

OTHER PUBLICATIONS

Machine-generated English translation of Japanese Patent Application No. 2009-025427 published Feb. 5, 2009.

* cited by examiner (1-a)　　　(1-b)　　　(1-c)

(2-a)　　　(2-b)

(3-a)

(3-b)

(7-a)

(7-b)

though it appears to be a thick layer but is substantially made of a thin film, gives a light extraction efficiency that is higher than that of a conventional substrate, and therefore can suppress the energy loss to be caused by reflection, or the like so that the external energy efficiency is improved.

SUBSTRATE AND ORGANIC EL LIGHT-EMITTING APPARATUS

CROSS REFERENCE TO RELATED APPLICATIONS

This application is a National Stage of International Application No. PCT/JP2010/053189 filed Feb. 23, 2010, claiming priority based on Japanese Patent Application Nos. 2009-040304 filed Feb. 24, 2009, and 2009-040305 filed Feb. 24, 2009, the contents of all of which are incorporated herein by reference in their entirety.

TECHNICAL FIELD

The present invention relates to a substrate for use in an organic electroluminescent (organic EL) light-emitting apparatus, and the like.

BACKGROUND ART

Organic electroluminescent (organic EL) light-emitting apparatuses have superior characteristics such as less viewing angle dependence, low power consumption and a high realizability of a very thin structure, and have newly drawn public attentions as light-emitting apparatuses due to increasing demands for flat displays. In an attempt to practically use such organic EL light-emitting apparatuses, one of problems is that the light-emitting life thereof is short. In order to solve this problem, heretofore, the improvements of the light-emitting layer materials and the like of an organic EL device to be installed in organic EL light-emitting apparatuses have been vigorously carried out.

On the other hand, in order to improve the light-emitting life, an attempt has been made to improve the external energy efficiency of the organic EL device. It has been known that the external energy efficiency is represented by the product of the internal energy efficiency and light extraction efficiency of a device. That is, in order to improve the external energy efficiency of the organic EL device, there is a method in which in addition to the improvement of the internal energy efficiency, the light extraction efficiency is also improved.

The light extraction efficiency refers to the rate of the quantity of light released into the atmosphere from the front side of an organic EL light-emitting apparatus to the quantity of light emitted from the light-emitting layer of an organic EL device. When light emitted from the light-emitting layer is released into the atmosphere, the light needs to pass through some interfaces, each formed between media having different refractive indexes, and based upon Snell's law, light that is made incident on each interface with an angle that is greater than its critical angle, is totally reflected by the interface to progress into the layer to disappear, or is released from the side faces of the layer, with a result that the quantity of light to be released from the front side of an organic EL light-emitting apparatus is reduced by the corresponding portion. The light extraction efficiency of the light-emitting layer of a conventional organic EL device is about 18%, with a result that about 82% of light generated in the light-emitting layer is confined inside the light-emitting apparatus to disappear, or is released from the side faces of the light-emitting apparatus.

For this reason, it is an important problem to improve the light extraction efficiency, and various attempts have been made. For example, a substrate has been proposed in which one of the surfaces of a glass substrate is rubbed with an abrasive material or the like to be roughened, and this is used as a transparent substrate so that light emission is scattered (Patent Document 1: Japanese Patent Laid-open Publication No. 61-156691), and a substrate has been proposed in which a light-emitting layer is sandwiched with a pair of transparent electrode layers, with a scattering region being provided in the vicinity of the interface between the transparent electrode layer and the light-emitting layer (Patent Document 2: Japanese Patent Laid-open Publication No. 09-129375).

SUMMARY OF THE INVENTION

However, each of the attempts disclosed in Patent Document 1 and Patent Document 2 disturbs the film thickness of each of organic EL device layers, with a result that insulation breakdown and ununiformity in light emission might be caused, and therefore there is a drawback that the quality of an organic EL light-emitting apparatus tends to be lowered. Moreover, it cannot be said that the light extraction efficiency thereof is sufficient.

An objective of the present invention is to provide a substrate that can achieve high light extraction efficiency, and to provide an organic EL light-emitting apparatus with high light-emitting efficiency by using such a substrate.

The present invention provides the following <1>.

<1> A substrate comprising a transparent substrate and a light-concentrating structural body layer, wherein the light-concentrating structural body layer includes a plurality of structural bodies having a conic shape or a hemispherical shape, with the bottom faces of the plurality of structural bodies having a conic shape or a hemispherical shape being located on the same plane.

Moreover, as specific embodiments relating to <1>, the present invention provides the following <2> to <9>.

<2> The substrate of <1>, wherein each of the structural bodies is a structural body having a cone shape, a square pyramid shape or a triangular pyramid shape.

<3> The substrate of <2>, wherein an aspect ratio (B/A) to be obtained from the longest major axis A of the bottom face of the structural body and the height B of the structural body is in a range from 0.2 to 3.0.

<4> The substrate of <2> or <3>, wherein the sum of the bottom face areas of the structural bodies is in a range from 10% by area to 100% by area based upon the area of the transparent substrate.

<5> The substrate of <2> or <3>, wherein the sum of the bottom face areas of the structural bodies is in a range from 40% by area to 90% by area based upon the area of the transparent substrate.

<6> The substrate of <1>, wherein the structural body is a structural body having a hemispherical shape.

<7> The substrate of <6>, wherein the sum of the bottom face areas of the structural bodies is 40% by area or more based upon the area of the transparent substrate.

<8> The substrate of any one of <1> to <7>, wherein the structural body is composed of a transparent resin having a light transmittance of 80% or more at a wavelength of 550 nm.

<9> The substrate of any one of <1> to <7>, wherein the structural body is composed of a resin composition containing titanium oxide and a transparent resin.

Moreover, the present invention provides an organic EL light-emitting apparatus comprising the substrate of any one of <1> to <9> and an organic EL device.

The present invention makes it possible to provide a substrate that can achieve high light extraction efficiency and consequently improve the external energy efficiency of an organic EL device. The substrate, which can provide an organic EL light-emitting apparatus with high light-emitting efficiency, is industrially very useful.

EMBODIMENT FOR CARRYING OUT THE INVENTION

Figure 1:
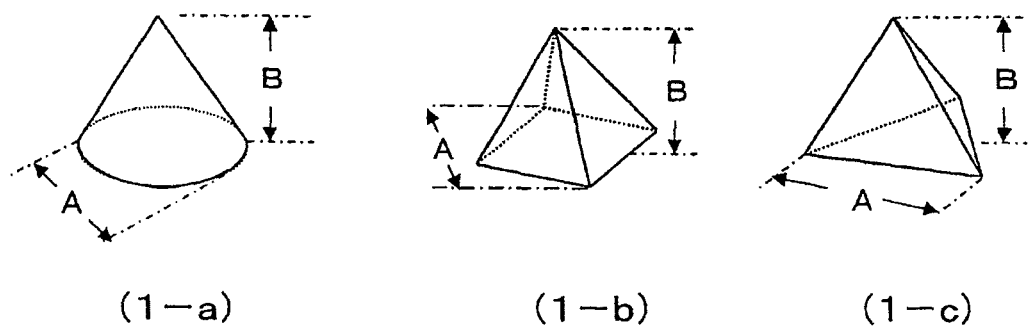
FIG. 1 is a view that schematically shows the shapes of structural bodies having a conic shape.

The substrate of the present invention is a substrate which comprises a transparent substrate and a light-concentrating structural body layer, and in the substrate, the light-concentrating structural body layer includes a plurality of structural bodies having a cone shape or a hemispherical shape, and the bottom faces of the structural bodies are located on the same plane.

The following description will discuss the present invention in detail with reference to drawings, if necessary, but those components that are the same are indicated by the same reference numerals, and overlapped explanations will be omitted. Moreover, in the drawings, the dimensions and the like thereof are optionally determined for convenience of explanation.

<Transparent Substrate>

As a transparent substrate to be used in the present invention, a substrate having a light transmittance of 80% or more at a wavelength of 550 nm is preferably used. This transparent substrate can be made from glass, a transparent resin, or a combined material of these. If appropriate flexibility is demanded as the substrate for an organic EL light-emitting apparatus, transparent resins having superior bendability are preferable, and specifically, transparent substrates composed of transparent resins such as cyclic polyolefin, polyarylate (PAR), polyamideimide (PAI), polyimide (PI), polyetherimide (PEI), polyethersulfone (PES), polyethylene terephthalate (PET), polyethylene naphthalate (PEN), polycarbonate (PC), polysulfone (PSF), and polymethylpentene (PMP).

The thickness of the transparent substrate to be used in the present invention is determined so as to satisfy the above-mentioned light transmittance. When the transparent substrate is composed of a desirable transparent resin, the thickness thereof is preferably in a range from 10 μm to 500 μm, more preferably from 50 μm to 150 μm.

The transparent substrate composed of such a transparent resin can be obtained by processing the transparent resin to form a film by using a known film-forming method such as extrusion molding, a solvent casting method, or the like.

The transparent substrate to be used in the present invention preferably has a refractive index of 1.1 or more, more preferably 1.4 or more. The refractive index is normally 2.0 or less.

<Light-Concentrating Structural Body>

The light-concentrating structural body layer includes a plurality of structural bodies having a conic shape or a hemispherical shape (can be referred to as light-concentrating structural bodies). As a material for forming the structural bodies, those having a refractive index of 1.7 or more are preferable. The refractive index is more preferably 1.8 or more, and particularly preferably 2.0 or more. The upper limit of the refractive index is preferably 2.2. Such a material is preferably a material prepared by using an appropriate resin as a binder (hereinafter, referred to as "binder resin") and dispersing an inorganic material having a high refractive index in this binder resin. As the inorganic material having a high refractive index, mentioned herein, for example, particles of an inorganic material having a high refractive index (hereinafter, referred to as "high refractive-index inorganic particles") such as zinc oxide, zinc sulfide, white lead, zinc telluride, zinc yellow, lead titanate, red lead, chrome green, chromium oxide, zirconium oxide, cadmium oxide, cadmium sulfide, ferric oxide, ferric trioxide, titanium oxide, barium titanate, barium sulfide, strontium titanate, strontium sulfide, mercury sulfide, germanium, thallium chloride, thallium bromide, or arsenic selenide may be used. Among these, high refractive-index inorganic particles composed of titanium oxide [rutile type titanium dioxide (refractive index: 2.7), anatase type titanium dioxide (refractive index: 2.5)] or zirconium oxide (refractive index: 2.4) are preferable. Moreover, in order to improve the transparency of the light-concentrating structural body, the high refractive-index inorganic particles have an average particle size of preferably 200 nm or less, more preferably 100 nm or less, and particularly preferably 50 nm or less. When the high refractive-index inorganic particles have an average particle size exceeding 200 nm, the transparency of the light-concentrating structural body tends to be easily lowered. Among the above exemplified high refractive-index inorganic particles, titanium oxide having an average particle size of 50 nm or less makes it possible to form a light-concentrating structural body having superior transparency, and has a high refractive index; therefore, this material is in particularly preferable. Additionally, the average particle size, mentioned herein, refers to a volume-average particle size obtained by measuring a uniform dispersion solution of the high refractive-index inorganic particles by using a dynamic light-scattering method.

As the binder resin, a resin with transparency (transparent resin) is particularly preferable. Examples of such a transparent resin include curable resins such as silicone-based resins, epoxy-based resins, urethane-based resins, acryl-based resins, cyanoacrylate-based resins, epoxy-based acrylate resins, polyester-based acrylate resins, polyurethane-based acrylate resins, polyhydric alcohol-based acrylate resins and polythiol polyene resins, and thermoplastic resins such as polyimide-based resins, polystyrene-based resins and polycarbonate-based resins. Additionally, with respect to the binder resin, in the case of forming the light-concentrating structural body by using only the binder resin, those that allow the light-concentrating structural body to have a light transmittance of 80% or more at visible light (wavelength; 550 nm) are preferable.

As preferable examples of the binder resin, resins that can be cured by operations such as light irradiation, electron-beam irradiation, heating, drying and pressure application, are preferable from the viewpoint that they make it possible to easily carry out processes in which a plurality of the light-concentrating structural bodies are formed so as to produce a light-concentrating structural body layer. In other words, curable resins are preferably used as the binder resin, and as the curable resins, thermo-curable resins, photo-curable resins or moisture-curable resins are preferable.

To the binder resin, if necessary, a surfactant, an adhesion reinforcing agent, a cross-linking agent, a sensitizer, and a photosensitive agent may also be added.

In order to form the light-concentrating structural body, a resin composition containing the binder resin and the high refractive-index inorganic particles is preferably used. The resin composition may also contain an appropriate organic solvent and a thickener so as to easily form the light-concentrating structural body. A volume ratio between the high refractive-index inorganic particles and the binder resin contained in the resin composition is preferably in a range from 20/80 to 60/40, when represented by high refractive-index inorganic particles/binder resin. When the volume fraction of the high refractive-index inorganic particles is less than 20% by volume, the refractive index of the light-concentrating structural body is hardly increased, and when it exceeds 60% by volume, the dispersing property of the high refractive-index inorganic particles in the light-concentrating structural body is lowered, with a result that the transparency tends to be lowered. In order to improve the dispersing property of the high refractive-index inorganic particles in the binder resin, a method such as a high-pressure dispersing method, a jet mill method or a beads mill method, may be used upon preparing the resin composition. Additionally, in the case where a curable resin is used as the binder resin, the volume ratio, mentioned herein, is calculated based upon volumes after the curable resin has been cured.

The shape of the light-concentrating structural body is a conic shape or a hemispherical shape. As the conic shape, more preferably, a cone shape, a square pyramid shape or a triangular pyramid shape, and particularly preferably, a square pyramid shape or a triangular pyramid shape. The light-concentrating structural bodies are arranged on the same plane, and the surfaces of the light-concentrating structural bodies on the same plane are referred to as "bottom faces of the light-concentrating structural bodies". The bottom face of the light-concentrating structural body having a cone shape is a round shape, the bottom face of the light-concentrating structural body having a square pyramid shape is a square shape, and the bottom face of the light-concentrating structural body having a triangular pyramid shape is a triangular shape. A plurality of the light-concentrating structural bodies, contained in the light-concentrating structural body layer, may be formed by combining those having a cone shape, those having a square pyramid shape and those having a triangular pyramid shape with one another; however, a light-concentrating structural body layer containing only the light-concentrating structural bodies having a spindle shape, only the light-concentrating structural bodies having a triangular pyramid shape, or only the light-concentrating structural bodies having a square pyramid shape is preferable.

FIG. 1 is a view that schematically shows the shapes of light-concentrating structural bodies having conic shapes, and FIG. 1-a) schematically shows the shape of a light-concentrating structural body having a cone shape, FIG. 1-b) schematically shows the shape of a light-concentrating structural body having a square pyramid shape, and FIG. 1-c) schematically shows the shape of a light-concentrating structural body having a triangular pyramid shape, respectively.

The light-concentrating structural bodies having a conic shape preferably have an aspect ratio (B/A), which is obtained by the longest major axis A of the bottom face and the height B thereof, of from 0.2 to 3.0, more preferably from 0.3 to 2.0. When the aspect ratio is within this range, it is superior in that the light-concentrating structural bodies are easily formed by using a forming method as will be described later, and in that it becomes possible to provide more favorable light extraction efficiency. With reference to FIG. 1 again, the following description will discuss the aspect ratio. As shown in FIG. 1(1-a), in a light-concentrating structural body having a cone shape, when a plurality of lines passing through its center point are drawn in the circle on the bottom face, the longest line among the plurality of lines forms the longest major axis A. As shown in FIG. 1(1-b), in a light-concentrating structural body having a square pyramid shape, the longer of the two diagonal lines in the square shape on the bottom face forms the longest major axis A. As shown in FIG. 1(1-c), in a light-concentrating structural body having a triangular pyramid shape, the longest of the three sides which constitute triangle, in the triangle of the bottom face, forms the longest major axis A. In this case, the distance from the bottom face of the light-concentrating structural body to the highest point of the light-concentrating structural body is the height B of the light-concentrating structural body. The aspect ratio (B/A) corresponds to a value obtained by dividing the height B by the longest major axis A. Additionally, with respect to the light-concentrating structural bodies having a conic shape, those having a longest major axis A of from 2 μm to 130 μm are preferable, and those having a longest major axis A of from 6 μm to 24 μm are more preferable.

Figure 5:
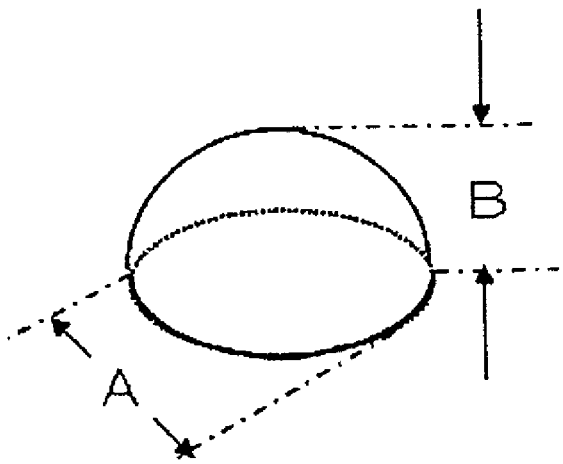
FIG. 5 is a view that schematically shows the shape of a structural body having a hemispherical shape.

The light-concentrating structural body having a hemispherical shape forms a micro-lens having a convex lens shape, and preferably has an aspect ratio (B/A), which is obtained by the longest major axis A of the bottom face and the height B thereof, of from 0.2 to 1.5, more preferably from 0.2 to 0.8. The light-concentrating structural body having a hemispherical shape with an aspect ratio in this range is advantageous in that high light extraction efficiency is obtained. With reference to FIG. 5, the following description will discuss the aspect ratio. As shown in FIG. 5, in a light-concentrating structural body having a hemispherical shape, when a plurality of lines passing through its center point are drawn in the circle on the bottom face, the longest line among the plurality of lines forms the longest major axis A. In this case, the distance from the bottom face of the light-concentrating structural body to the highest point of the light-concentrating structural body is the height B of the light-concentrating structural body. The aspect ratio (B/A) corresponds to a value obtained by dividing the height B by the longest major axis A. With respect to the light-concentrating structural bodies having a hemispherical shape, those having a longest major axis A of from 2 μm to 130 μm are preferable, and those having a longest major axis A of from 6 μm to 24 μm are more preferable.

<Light-Concentrating Structural Body Layer>

A light-concentrating structural body layer in the present invention includes a plurality of light-concentrating structural bodies. The bottom faces of the plurality of light-concentrating structural bodies are on the same plane.

The light-concentrating structural body layer preferably contains a filling resin with which gaps among the plurality of light-concentrating structural bodies are filled. As the filling resin, a transparent resin having a refractive index lower than that of the light-concentrating structural body is preferable. As the transparent resin, those that are the same as those exemplified as the binder resin are proposed. Moreover, the filling resin may contain, if necessary, a surfactant, an adhesion reinforcing agent, a cross-linking agent, a sensitizer, and a photosensitive agent. In this case, the binder resin forming the light-concentrating structural body and the filling resin may be the same resin, or different resins may be used.

In order to obtain the light-concentrating structural body layer containing a plurality of light-concentrating structural bodies, for example, the following processes may be proposed.

First, a material that can be formed into the light-concentrating structural bodies is applied onto the transparent substrate. Such a coating process may be carried out by using, for example, a coating method such as a knife coater, a die coater, a capillary coater, a roll coater, a blade coater, a rod coater or a spray coater. Among these, the coating method is preferably carried out by using a knife coater, a die coater, or a capillary coater. Next, the material coated on the transparent substrate is brought to a state where the material has flexibility to an extent that its shape can be processed. For this purpose, in the case where the binder resin contained in the material is a thermoplastic resin, the thermoplastic resin is, for example, heated to such a degree as to have plasticity, and brought into a plastic state. In the case where the binder resin contained in the material is a curable resin, the resin is maintained in an appropriately cured state, that is, a so-called semi-cured state. Next, a stamper on which a plurality of concave portions are provided so as to form light-concentrating structural bodies having a desired shape is prepared, and by pressing this stamper onto the material in a plastic state or in a semi-cured state on the transparent substrate, the concave pattern provided on the stamper can be transferred onto the material so that a plurality of light-concentrating structural bodies are formed on the transparent substrate. The light-concentrating structural bodies thus formed are cooled, if necessary, or the curable resin in a semi-cured state is further cured so that the shape can be fixed. For example, in the case where an ultraviolet-ray curable resin such as an acrylic resin, is used as the binder resin, after a resin composition containing the acrylic resin has been applied onto the transparent substrate, the resin composition thus coated is weakly irradiated with UV rays so as to be semi-cured, and onto the resin composition after having been semi-cured, a stamper on which concave portions capable of forming desired light-concentrating structural bodies are provided is pressed so that the light-concentrating structural bodies are formed on the transparent resin, and this is further irradiated with UV rays so as to cure the acrylic resin in a semi-cured state; thus, it is possible to obtain light-concentrating structural bodies having a shape that has been fixed. In order to fill the gaps among the light-concentrating structural bodies obtained in this manner, the layer of the filling resin is preferably formed. More specifically, after a liquid-state composition containing an uncured curable transparent resin has been applied onto light-concentrating structural bodies 25, this is subjected to a drying process and the like, if necessary, and then further subjected to operations such as light irradiation, electron-beam irradiation, heating and pressure application, so as to be cured. A substrate 1 in FIG. 3(3-a) and a substrate 1 in FIG. 7(7-a) are obtained in this manner.

Figure 8:
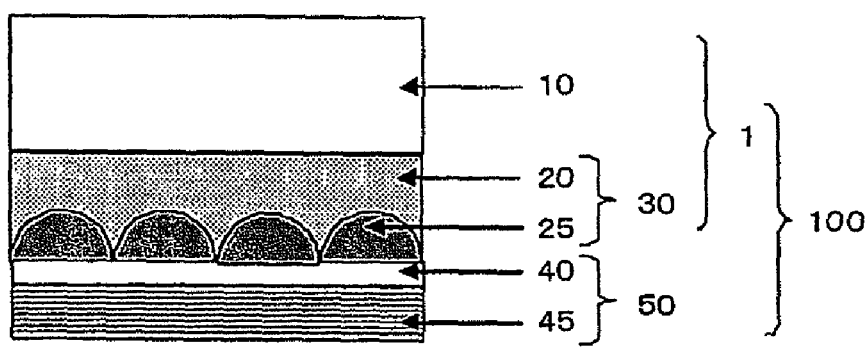
FIG. 8 is a schematic cross-sectional view that shows one example of a device constitution provided with the substrate of the present invention.

The following method is another method to obtain a light-concentrating structural body layer having a plurality of light-concentrating structural bodies. First, the material of a filling resin is applied onto the transparent substrate. Such a coating process may be carried out by using, for example, a coating method such as a knife coater, a die coater, a capillary coater, a roll coater, a blade coater, a rod coater and a spray coater. Among these, the coating method is preferably carried out by using a knife coater, a die coater, or a capillary coater. Next, the material coated on the transparent substrate is brought into a state where the material has flexibility to an extent that it can be processed into a specific shape. For this purpose, in the case where the material is a thermoplastic resin, the thermoplastic resin is, for example, heated to such a degree as to have plasticity, and brought into a plastic state. In the case where the material is a curable resin, the resin is maintained in an appropriately cured state, that is, a so-called semi-cured state. Next, a stamper on which a plurality of light-concentrating structural bodies having a desired shape are provided is prepared, and by pressing this stamper onto the material in a plastic state or in a semi-cured state on the transparent substrate, the concave portions corresponding to the shapes of the light-concentrating structural bodies are formed. The concave portions thus formed are cooled, if necessary, or the curable resin in a semi-cured state is further cured so that the shape can be fixed. Next, a material that is allowed to form light-concentrating structural bodies is put into the concave portions thus formed so as to form light-concentrating structural bodies. As the material used for this method so as to form the light-concentrating structural bodies, the curable resin is preferable. For example, in the case where an ultraviolet-ray curable resin such as an acrylic resin, is used as the binder resin, after a resin composition containing the acrylic resin has been applied onto a surface having concave portions corresponding to the shapes of the light-concentrating structural bodies, the resin composition thus coated is irradiated with UV rays so that light-concentrating structural bodies having a fixed shape can be obtained by curing the acrylic resin. A substrate 1 in FIG. 4 and a substrate 1 in FIG. 8 are obtained in this manner.

The following method is also proposed as another method. First, the transparent substrate is brought into a state where the substrate has flexibility to an extent that it can be processed into a specific shape. For this purpose, in the case where the material is a thermoplastic resin, the thermoplastic resin is, for example, heated to such a degree as to have plasticity, and brought into a plastic state. Next, a stamper on which a plurality of light-concentrating structural bodies having a desired shape are provided is prepared, and by pressing this stamper onto the transparent resin in a plastic state, the concave portions corresponding to the shapes of the light-concentrating structural bodies are formed. The concave portions thus formed are cooled, if necessary, so that the shapes can be fixed. Next, a material to be formed into light-concentrating structural bodies is put into the concave portions thus formed so that the light-concentrating structural bodies are formed.

Figure 2:
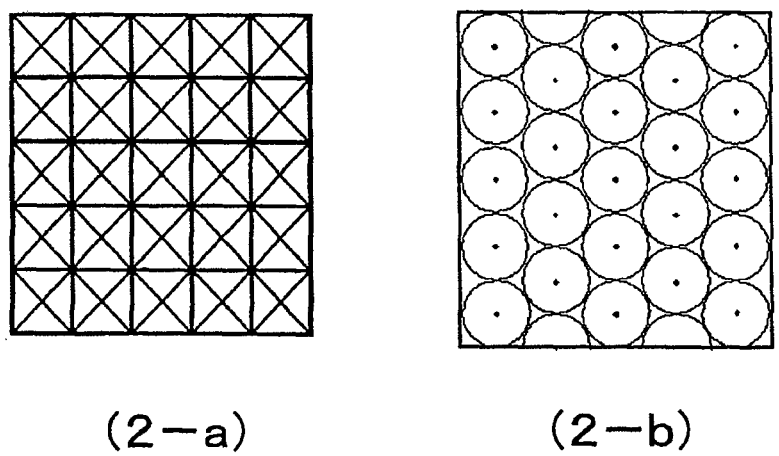
FIG. 2 is a schematic top view (2-*a*) that shows the arrangement of structural bodies in the case where square pyramid-shaped structural bodies occupy 100% by area in a light-concentrating structural body area ratio, and is a schematic top view (2-*b*) that shows the arrangement of structural bodies in the case where cone-shaped structural bodies are packed in closest manner.
Figure 6:
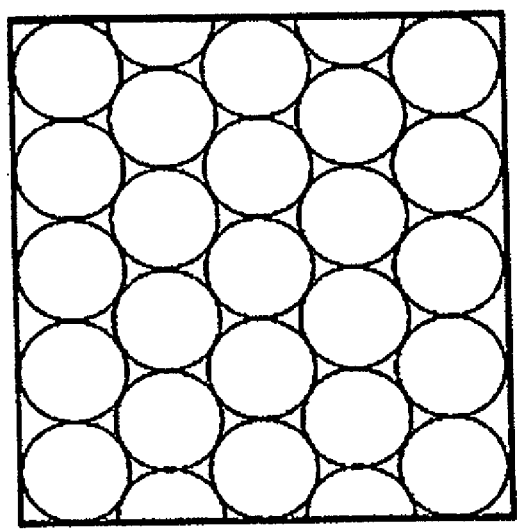
FIG. 6 is a schematic top view that shows the arrangement of structural bodies having a hemispherical shape in the case where a light-concentrating structural body area ratio becomes highest.

The number of the light-concentrating structural bodies contained in the light-concentrating structural body layer is determined based upon the shapes and dimensions (in particular, the longest major axis A of the bottom face) of the light-concentrating structural bodies, the area of the transparent substrate and the desired light extraction efficiency. In order to further enhance the light extraction efficiency of the substrate of the present invention, the sum of the areas of the bottom faces of the light-concentrating structural bodies, that is, the sum of the areas of the bottom faces of the light-concentrating structural bodies contained in the light-concentrating structural body layer, is preferably in a range from 10% by area to 100% by area, particularly preferably from 40% by area to 90% by area, based upon the area of the transparent substrate. The area ratio (Sa/St) of the sum (Sa) of the areas of the bottom faces of the light-concentrating structural bodies based upon the area (St) of the transparent substrate is hereinafter referred to as "light-concentrating structural body area ratio". A substrate that satisfies such a light-concentrating structural body area ratio is preferable because of its superior in light-extraction efficiency. (2-a) of FIG. 2 is a schematic top view that shows one example of the constitution of a light-concentrating structural body layer in which each of the plurality of light-concentrating structural bodies has a square pyramid shape, and its light-concentrating structural body area ratio is substantially 100% by area. Moreover, (2-b) of FIG. 2 is a schematic top view that shows one example of the constitution of a light-concentrating structural body layer in which each of the plurality of light-concentrating structural bodies has a cone shape. In the case where each of the light-concentrating structural bodies has a cone shape, it is not possible to make the light-concentrating structural body area ratio 100% by area, and the light-concentrating structural body area ratio is about 72% by area at maximum (closest packed state). FIG. 6 is a schematic top view that shows the case where each of the plurality of light-concentrating structural bodies has a hemispherical shape, with the light-concentrating structural body area ratio being the maximum. In FIG. 6, the light-concentrating structural body area ratio is about 72% by area.

<Organic EL Light-Emitting Apparatus>

Figure 7:
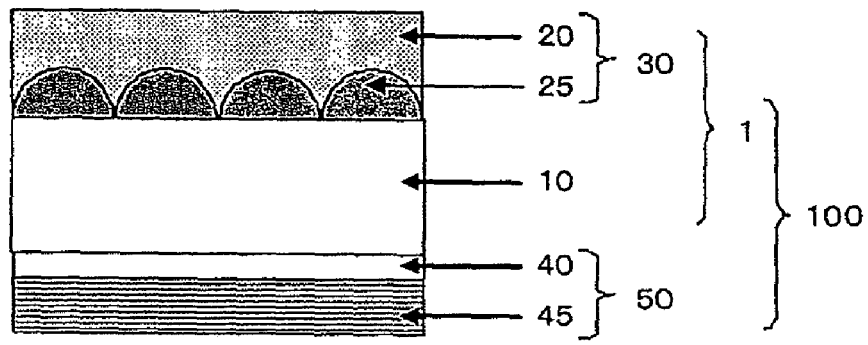
FIG. 7 is a schematic cross-sectional view that shows a device constitution provided with the substrate of the present invention and a device constitution not provided with the substrate of the present invention.
Figure 7:
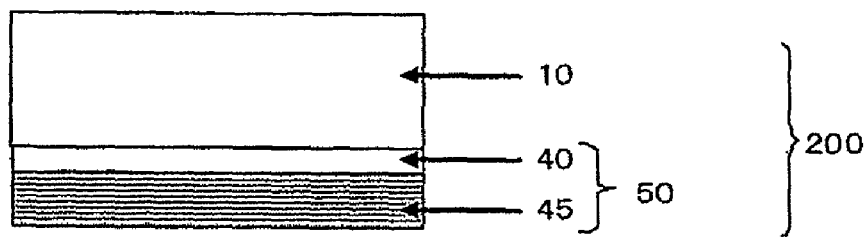

In particular, the substrate of the present invention is desirably applied to a light-emitting apparatus that uses an organic EL device as a light-emitting source. Each of (3-a) of FIG. 3 and (7-a) of FIG. 7 is a schematic cross-sectional view that shows the outline of a device constitution 100 in which the substrate of the present invention and an organic EL device are combined with each other. A substrate 1 in the present invention is formed with a transparent substrate 10 and a light-concentrating structural body layer 30 as described earlier. In the device constitution 100, an organic EL device 50 is provided on the surface of the substrate 1 on which a light-concentrating structural body layer 30 is not provided.

The organic EL device 50 is formed with an organic layer containing a light-emitting layer and a pair of electrode layers provided in a manner so as to sandwich the organic layer. Moreover, if desired, a charge injection layer, a hole transporting layer, an electron transporting layer, and the like may be provided thereon.

The following description will briefly discuss a layer constituting the organic EL device 50.

At least one of the paired electrodes in the organic EL device 50 is a transparent electrode. As a material for the transparent electrode, a material having high work function is preferable when the transparent electrode is an anode, and a conductive metal oxide film, a translucent metal thin film or the like is used. More specifically, those made of using conductive materials such as indium oxide, zinc oxide or tin oxide, or a composite material thereof such as indium-tin-oxide (ITO) or indium-zinc-oxide are proposed. The film thickness of the transparent resin is normally in a range from 50 nm to 400 nm.

On the other hand, when the transparent electrode is a cathode, a material having low work function is preferable as a material for the transparent electrode. Examples thereof to be used include metals such as lithium, sodium, potassium, rubidium, cesium, beryllium, magnesium, calcium, strontium, barium, aluminum, scandium, vanadium, zinc, yttrium, indium, cerium, samarium, europium, terbium and ytterbium; alloys containing two or more thereof; alloys between one thereof and one or more of gold, silver, platinum, copper, manganese, titanium, cobalt, nickel, tungsten and tin; and graphite or a graphite interlayer compound. Examples of the alloys include magnesium-silver alloys, magnesium-indium alloys, magnesium-aluminum alloys, indium-silver alloys, lithium-aluminum alloys, lithium-magnesium alloys, lithium-indium alloys and calcium-aluminum alloys.

The other electrode, that is, the electrode that requires no transparency normally has a layer (halogenated alkali metal layer) composed of a halide of alkali metal (for example, lithium fluoride or the like). Moreover, in some cases, this halogenated alkali metal layer may be further laminated with a metal (aluminum) layer for use. In this case, the film thickness of the other electrode is also normally in a range from 50 nm to 400 nm.

With respect to the substrate of the present invention, the transparent electrode may also be used as the transparent substrate.

The light-emitting layer in the organic EL device is constituted of an organic EL light-emitting material. Examples of such a light-emitting material include known materials such as materials described in Seishi Tokitoh et al., "Organic EL Display" chapter 6 (pp. 101 to 116) published on Aug. 20, 2004, by Ohmsha, Ltd.

Figure 3:
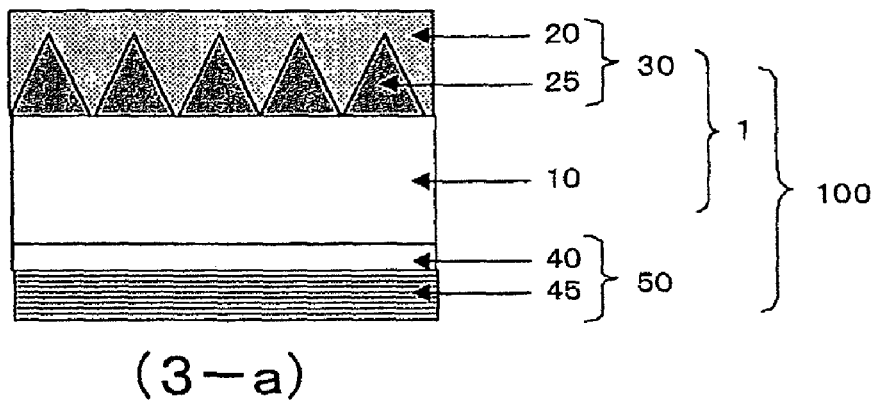
FIG. 3 is a schematic cross-sectional view that shows a device constitution provided with the substrate of the present invention and a device constitution not provided with the substrate of the present invention.
Figure 3:
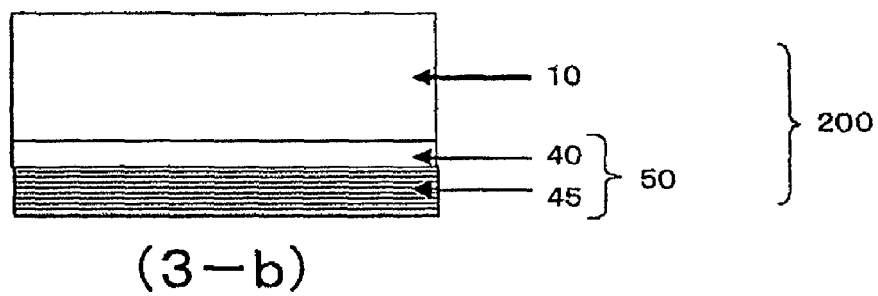

Each of (3-b) of FIG. 3 and (7-b) of FIG. 7 is a schematic cross-sectional view that shows a device constitution 200 in which a substrate not provided with the light-concentrating structural body layer is used. The organic EL device 50 is provided on a transparent substrate 10 not provided with the light-concentrating structural body layer. In the device constitution 200 shown in FIG. 3(3-b) or FIG. 7(7-b), since no light-concentrating structural body layer is provided, its light extraction efficiency is low as described in background art above, and most of light generated in the light-emitting layer is confined in the device to disappear, or released from the side faces of the device constitution.

<Light Extraction Magnification Ratio>

Next, the following description will discuss an evaluation method for a light extraction magnification ratio that represents the light extraction efficiency of the organic EL light-emitting apparatus using the substrate of the present invention. In the device constitution 100 provided with the substrate 1 of the present invention (FIG. 3(3-a), FIG. 4, FIG. 7(7-a) and FIG. 8) and the device constitution 200 not provided with the light-concentrating structural body (FIG. 3(3-b) and FIG. 7(7-b)), the light intensity thereof is calculated by using the following calculation method, and the light extraction magnification ratio can be obtained.

[Calculation Method for Determining Light Extraction Magnification Ratio]

By using a light-ray tracking method, the propagation of light in the substrate of the present invention can be simulated. The light-ray tracking method, mentioned herein, is a method in which, by geometric-optically tracking light progression, reflection and refraction, behaviors of light can be calculated. In the light-ray tracking method, it is necessary to calculate reflection and refraction on the interface between media having different refractive indexes, and normally, simulations on reflected and refracted angles are carried out based on calculations by using Snell's low, and simulations on the light intensity of reflection and refraction are carried out based on calculations by using Fresnel's low. In the simulation, it may be defined that on the interface on which media having different refractive indexes are adjacent to each other, reflected and refracted light is branched at an intensity ratio obtained by Fresnel's low, or by using Monte Carlo method, reflected light and refracted light may be selected based upon the probability given by an intensity ratio obtained by Fresnel's law. The intensity of light propagated in a specific direction can be obtained by the product of an intensity per light ray propagated in the direction and the number of light rays. Additionally, the light extraction magnification ratio of the present invention is represented by the light-emitting intensity of the device constitution 100 provided with the light-concentrating structural body layer of the present invention, obtained on the assumption of 1 in the light-emitting intensity of the device constitution 200 shown in FIG. 3(3-*b*) or FIG. 7(7-*b*).

In the case of using the above-mentioned light extraction magnification ratio, the device constitution 100 provided with the substrate 1 of the present invention is allowed to achieve a superior light extraction efficiency exceeding 2.0 times or more of that obtained based upon the device constitution 200, and in the case where a structure provided with light-colleting structure bodies having a triangular pyramid shape, the light extraction magnification ratio can be increased to 2.3 times or more. Therefore, since the organic EL light-emitting apparatus provided with the substrate of the present invention makes it possible to effectively extract light generated in the light-emitting layer, the apparatus can be used with a smaller electric current, and achieves an organic EL light-emitting apparatus having a superior light-emitting life.

EXAMPLES

Description of Simulation

In the present examples, by using a TracePro (ver. 4.1.7) made by Lambda Research Corporation, selection by use of Monte Carlo method is used as a branching method for light on the interface with media having different refractive indexes so that simulation processes are carried out to obtain light extraction magnification ratios.

Figure 4:
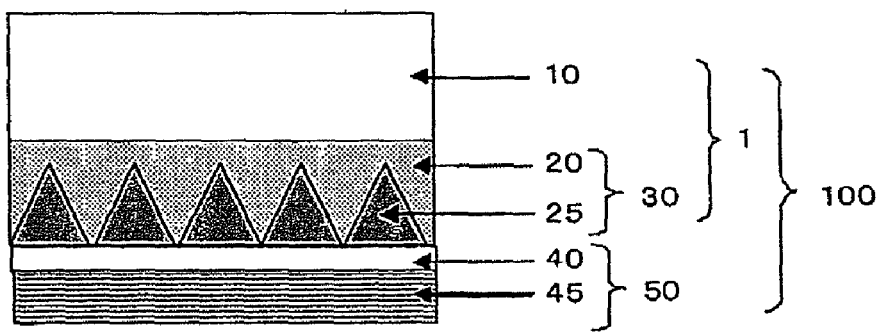
FIG. 4 is a schematic cross-sectional view that shows one example of a device constitution provided with the substrate of the present invention.

In the same manner as in shown in FIG. 4 and FIG. 8, a device constitutional model used in the simulation processes has a structure in which a light-emitting layer, a transparent electrode layer, a light-concentrating structural body layer and a transparent substrate are successively stacked in this order, and a space between the light-concentrating structural bodies and the transparent substrate is filled with a substance having the same refractive index as that of the transparent substrate. The thickness of the light-emitting layer was made to be 100 μm, and the thickness of the transparent electrode layer was also made to be 100 μm. The thickness of the light-concentrating structural body layer was determined based upon an aspect ratio, with the sum of the thicknesses of the light-concentrating structural body layer and the transparent substrate being 1.8 mm. Light is supposed to be emitted from the light-emitting layer and released from the transparent layer, after passing through the respective layers of the device constitutional model, with external walls (including the side faces of the transparent substrate) other than the light releasing surface of the model being prepared as mirror surfaces that completely reflect all light. The light intensity (quantity of light) of light released from the light releasing surface was calculated.

A detector having a cylindrical shape with a bottom face radius of 290 mm and a height of 16 mm was supposed, and a device constitutional model was arranged in the center of the detector so that light was made incident on the side face of the detector. The detector had upper and lower bottom faces serving as reflection borders, with the side face serving as an observation surface. Light is released from a surface that is set in the center of the light-emitting layer in parallel with the device bottom face, and on the assumption that 10000 light rays in a simulation process of one time, calculations of 20 times were executed, and the average extraction was defined as light-emitting intensity. Moreover, in the case where one light ray had been reflected 1000 times, the light ray was regarded as being lost, and the corresponding calculations were suspended.

Examples 1 to 3

Supposing that a device constitutional model [in this device constitutional model, a combination of light-emitting layer/transparent electrode corresponds to an organic EL device] in which a light-emitting layer (refractive index: 1.7)/a transparent electrode (refractive index: 2.0)/a light-concentrating structural body/a transparent substrate (refractive index: 1.5) are stacked in this order is prepared, the number of light rays (number of released light rays 1) released outside of the transparent substrate from the light-emitting layer in this device constitutional model was obtained by simulations.

Moreover, supposing that a comparative device constitutional model without the light-concentrating structural body, that is, a structure in which a light-emitting layer (refractive index: 1.7)/a transparent electrode (refractive index: 2.0)/a transparent substrate (refractive index: 1.5) are stacked, is also prepared in the same manner, a number of released light rays (number of released light rays 2) as a reference number was obtained. Moreover, the number of released light rays 1 was divided by the number of released light rays 2 so that a light extraction magnification ratio was obtained. In this case, the light-concentrating structural body in the device constitutional model was designed to have a cone shape formed from a material having a refractive index of 2.0, and the longest major axis A of the bottom faces of the light-concentrating structural bodies having a cone shape was made to be 24 μm. Moreover, supposing that the bottom faces of the light-concentrating structural bodies are in the closest packed state, the light-concentrating structural body area ratio was made to be 72% by area. The aspect ratios of the light-concentrating structural bodies were 0.5 (Example 1), 1.0 (Example 2) and 2.0 (Example 3), respectively. The bottom face of each of the device constitutional models was a square having a one-side length of 120 μm.

Examples 4 to 6

The light extraction magnification ratios were obtained by using the same method as in Examples 1 to 3. In this case, however, each of the light-concentrating structural bodies in the device constitutional models had a square pyramid shape, and the longest major axis A of the bottom faces of the light-concentrating structural bodies having a square pyramid shape was made to be 24 μm. Moreover, the light-concentrating structural body area ratio was made to be 100% by area. The aspect ratios of the light-concentrating structural bodies were 0.5 (Example 4), 1.0 (Example 5) and 2.0 (Example 6), respectively. The bottom face of each of the device constitutional models was a square having a one-side length of 120

Examples 7 to 9

The light extraction magnification ratios were obtained by using the same method as in Examples 1 to 3. In this case, however, each of the light-concentrating structural bodies in the device constitutional models had a triangular pyramid shape, and the longest major axis A of the bottom faces of the light-concentrating structural bodies having a triangular pyramid shape was made to be 24 μm. Moreover, the light-concentrating structural body area ratio was made to be 100% by area. The aspect ratios of the light-concentrating structural bodies were 0.5 (Example 7), 1.0 (Example 8) and 2.0 (Example 9), respectively. The bottom face of each of the device constitutional models was a square having a one-side length of 120 μm.

Examples 10 to 12

The light extraction magnification ratios were obtained by using the same method as in Examples 1 to 3. In this case, however, each of the light-concentrating structural bodies had a triangular pyramid shape, and was formed from a material having a refractive index of 1.8. The longest major axis A of the bottom faces of the light-concentrating structural bodies having a triangular pyramid shape was made to be 24 μm. Moreover, the light-concentrating structural body area ratio was made to be 100% by area. The aspect ratios of the light-concentrating structural bodies were 0.5 (Example 10), 1.0 (Example 11) and 2.0 (Example 12), respectively. The bottom face of each of the device constitutional models was a square having a one-side length of 120 μm.

Examples 13 to 16

The light extraction magnification ratios were obtained by using the same method as in Examples 1 to 3. In this case, however, each of the light-concentrating structural bodies had a triangular pyramid shape, and was formed from a material having a refractive index of 1.8. The longest major axis A of the bottom faces of the light-concentrating structural bodies having a triangular pyramid shape was made to be 24 with its aspect ratio being 0.5. Moreover, the light-concentrating structural body area ratios were 80% by area (Example 13), 60% by area (Example 14), 40% by area (Example 15) and 20% by area (Example 16), respectively. The bottom faces of the device constitutional models were squares having one-side lengths of 136 μm (Example 13), 156 μm (Example 14), 190 μm (Example 15) and 270 μm (Example 16), respectively.

Examples 17, 18

The light extraction magnification ratios were obtained by using the same method as in examples 1 to 3. In this case, however, each of the light-concentrating structural bodies had a triangular pyramid shape, and was formed from a material having a refractive index of 1.8. The light-concentrating structural body area ratio was made to be 100% by area, with its aspect ratio being 0.5. The longest major axes A of the bottom faces of the light-concentrating structural bodies having a triangular pyramid shape were 12 μm (Example 17) and 6 μm (Example 18), respectively. The bottom faces of the device constitutional models were squares having one-side lengths of 60 μm (Example 17) and 30 μm (Example 18), respectively.

TABLE 1

| | Shape of light-concentrating structural body | Longest major axis A (μm) | Aspect ratio | Refractive index of material | Light-concentrating structural body area ratio | Light extraction magnification ratio |
|---|---|---|---|---|---|---|
| Example 1 | Cone shape | 24 | 0.5 | 2.0 | 72 | 2.3 |
| Example 2 | Cone shape | 24 | 1.0 | 2.0 | 72 | 2.7 |
| Example 3 | Cone shape | 24 | 2.0 | 2.0 | 72 | 2.7 |
| Example 4 | Square pyramid shape | 24 | 0.5 | 2.0 | 100 | 2.4 |
| Example 5 | Square pyramid shape | 24 | 1.0 | 2.0 | 100 | 2.8 |
| Example 6 | Square pyramid shape | 24 | 2.0 | 2.0 | 100 | 2.6 |
| Example 7 | Triangular pyramid shape | 24 | 0.5 | 2.0 | 100 | 2.9 |
| Example 8 | Triangular pyramid shape | 24 | 1.0 | 2.0 | 100 | 2.9 |
| Example 9 | Triangular pyramid shape | 24 | 2.0 | 2.0 | 100 | 2.8 |
| Example 10 | Triangular pyramid shape | 24 | 0.5 | 1.8 | 100 | 2.9 |
| Example 11 | Triangular pyramid shape | 24 | 1.0 | 1.8 | 100 | 2.5 |
| Example 12 | Triangular pyramid shape | 24 | 2.0 | 1.8 | 100 | 2.3 |
| Example 13 | Triangular pyramid shape | 24 | 0.5 | 1.8 | 80 | 2.9 |
| Example 14 | Triangular pyramid shape | 24 | 0.5 | 1.8 | 60 | 2.8 |
| Example 15 | Triangular pyramid shape | 24 | 0.5 | 1.8 | 40 | 2.7 |
| Example 16 | Triangular pyramid shape | 24 | 0.5 | 1.8 | 20 | 2.5 |
| Example 17 | Triangular pyramid shape | 12 | 0.5 | 1.8 | 100 | 2.9 |
| Example 18 | Triangular pyramid shape | 6 | 0.5 | 1.8 | 100 | 2.8 |

Based upon the results of Examples 1 to 9, influences from the shapes of the light-concentrating structural bodies were compared, and it was found that, when the shape was a triangular pyramid shape, the light extraction magnification ratio was 2.9 times, which was the highest, and superior to that of a cone shape or a square pyramid shape. Moreover, in the case where the refractive index of the material was 1.8 in the light-concentrating structural body having a triangular pyramid shape, upon comparison of influences from the aspect ratio (examples 10 to 12), the light extraction magnification ratio was 2.9 times at the time of the aspect ratio of 0.5, which was the highest and the same as that of the material having a refractive index of 2.0. Moreover, with respect to the light-concentrating structural bodies having a triangular pyramid shape, when influences from the light-concentrating structural body area ratios were compared (Examples 13 to 16), it was found that the light extraction magnification ratio was 2.9 times at the time of 80% by area or more, which was substantially unchanged from that at the time of 100% by area, and that the light extraction magnification ratio was as high as 2.5 times, even at the time of 20% by area.

Examples 21 to 25

Supposing that a device constitutional model [in this device constitutional model, a combination of light-emitting layer/transparent electrode corresponds to an organic EL device] in which a light-emitting layer (refractive index: 1.7)/a transparent electrode (refractive index: 2.0)/a light-concentrating structural body/a transparent substrate (refractive index: 1.5) are stacked in this order is prepared, the number of light rays (number of released light rays 1) released outside of the transparent substrate from the light-emitting layer in this device constitutional model was obtained by simulations.

Moreover, supposing that a comparative device constitutional model without the light-concentrating body, that is, a structure in which a light-emitting layer (refractive index: 1.7)/a transparent electrode (refractive index: 2.0)/a transparent substrate (refractive index: 1.5) are stacked, is also prepared in the same manner, a number of released light rays (number of released light rays 2) as a reference number was obtained. Moreover, the number of released light rays 1 was divided by the number of released light rays 2 so that a light extraction magnification ratio was obtained.

Supposing that each of the light-concentrating structural bodies in the device constitutional model is composed of a hemispherical micro-lens formed from a material having a refractive index of 2.0, its longest major axis A was made to be 24 μm. Moreover, the aspect ratio of the hemispherical micro-lens was made to be 0.5, and the light-concentrating structural body area ratios were 72% by area (closest packed state, Example 21), 60% by area (Example 22), 40% by area (Example 23), 20% by area (Example 24) and 10% by area (Example 25), respectively. The bottom faces of the device constitutional models were squares having one-side lengths of 120 μm (Example 21), 131.69 μm (Example 22), 161.28 μm (Example 23), 228.09 μm (Example 24) and 322.57 μm (Example 25).

Examples 26 to 27

The light extraction magnification ratios were obtained by using the same method as in examples 21 to 25. In this case, however, the hemispherical micro-lens constituting the light-concentrating structural body in the device constitutional model was supposed to be formed from a material having a refractive index of 2.0, with the aspect ratio of the hemispherical micro-lens being 0.5, and the light-concentrating structural body area ratio was 72% by area that was the largest value. The longest major axes A were 12 μm (Example 26) and 6 μm (Example 27), respectively. The bottom faces of the device constitutional models were squares having one-side lengths of 60 μm (Example 26) and 30 μm (Example 27), respectively.

Examples 28 to 30

The light extraction magnification ratios were obtained by using the same method as in 21 to 25. In this case, however, the hemispherical micro-lens constituting the light-concentrating structural body in the device constitutional model was supposed to be formed from a material having a refractive index of 1.8, with the aspect ratio of the hemispherical micro-lens being 0.5, and the light-concentrating structural body area ratio was 72% by area that was the largest value. The longest major axes A were 24 μm (Example 28), 12 μm (Example 29), and 6 μm (Example 30), respectively. The bottom faces of the device constitutional models were squares having one-side lengths of 120 μm (Example 28), 60 μm (Example 29) and 30 μm (Example 30), respectively.

Based upon the results of examples 21 to 25, influences from the light-concentrating structural body area ratio were compared, and it was found that, when the area ratio was 40% or more, the light extraction magnification ratio was from 2.2 to 2.3, which was the same as that in the closest packed state (light-concentrating structural body area ratio: 72% by area), so that a high light extraction magnification ratio was maintained. When influences from the longest major axis A in the hemispherical micro-lens were compared (Examples 21, 26 and 27), the light extraction magnification ratio was from 2.3 to 2.4 within a range from 6 to 24 μm, which was substantially a constant value regardless of the size of the longest major axis A. Moreover, when influences from the refractive index were compared (Examples 21, 28, 29 and 30), the light extraction magnification ratio was reduced in response to the reduction in the refractive index; however, at a refractive index of 1.8, a high light extraction magnification ratio of 2.0 times was also obtained. Moreover, no reduction in the light extraction magnification ratio due to the longest major axis A was found. In the present invention, it can be said that even in the case of a low light-concentrating structural body area ratio, a high light extraction magnification ratio can be expected.

TABLE 2

| | Shape of light-concentrating structural body | Longest major axis A (μm) | Aspect ratio | Refractive index of material | Light-concentrating structural body area ratio | Light extraction magnification ratio |
| --- | --- | --- | --- | --- | --- | --- |
| Example 21 | Hemispherical micro-lens | 24 | 0.5 | 2 | 72 | 2.3 |
| Example 22 | Hemispherical micro-lens | 24 | 0.5 | 2 | 60 | 2.3 |
| Example 23 | Hemispherical micro-lens | 24 | 0.5 | 2 | 40 | 2.2 |

TABLE 2-continued

| | Shape of light-concentrating structural body | Longest major axis A (μm) | Aspect ratio | Refractive index of material | Light-concentrating structural body area ratio | Light extraction magnification ratio |
|---|---|---|---|---|---|---|
| Example 24 | Hemispherical micro-lens | 24 | 0.5 | 2 | 20 | 1.9 |
| Example 25 | Hemispherical micro-lens | 24 | 0.5 | 2 | 10 | 1.8 |
| Example 26 | Hemispherical micro-lens | 12 | 0.5 | 2 | 72 | 2.4 |
| Example 27 | Hemispherical micro-lens | 6 | 0.5 | 2 | 72 | 2.4 |
| Example 28 | Hemispherical micro-lens | 24 | 0.5 | 1.8 | 72 | 2.0 |
| Example 29 | Hemispherical micro-lens | 12 | 0.5 | 1.8 | 72 | 2.0 |
| Example 30 | Hemispherical micro-lens | 6 | 0.5 | 1.8 | 72 | 2.0 |

EXPLANATION OF REFERENCE NUMERALS

1 Substrate
10 Transparent substrate
20 Filling resin
25 Light-concentrating structural body
30 Light-concentrating structural body layer
40 Transparent electrode
45 Light-emitting layer, and the like
50 Organic EL device

The invention claimed is:

1. A substrate comprising:
a transparent substrate; and
a light-concentrating structural body layer,
wherein the light-concentrating structural body layer includes a plurality of structural bodies having a conic shape or a hemispherical shape, with the bottom faces of the plurality of structural bodies having a conic shape or a hemispherical shape being located on the same plane, and
wherein the light-concentrating structural body layer contains a transparent resin having a refractive index lower than that of the light-concentrating structural body as a filling resin with which gaps among the plurality of light-concentrating structural bodies are filled.

2. The substrate according to claim 1, wherein each of the structural bodies is a structural body having a cone shape, a square pyramid shape or a triangular pyramid shape.

3. The substrate according to claim 2, wherein an aspect ratio (B/A) to be determined from the longest major axis A of the bottom face of the structural body and the height B of the structural body is in a range from 0.2 to 3.0.

4. The substrate according to claim 2, wherein the sum of the bottom face areas of the structural bodies is in a range from 10% by area to 100% by area based upon the area of the transparent substrate.

5. The substrate according to claim 2, wherein the sum of the bottom face areas of the structural bodies is in a range from 40% by area to 90% by area based upon the area of the transparent substrate.

6. The substrate according to claim 1, wherein the structural body is a structural body having a hemispherical shape.

7. The substrate according to claim 6, wherein the sum of the bottom face areas of the structural bodies is 40% by area or more based upon the area of the transparent substrate.

8. The substrate according to claim 1, wherein the structural body is composed of a transparent resin having a light transmittance of 80% or more at a wavelength of 550 nm.

9. The substrate according to claim 1, wherein the structural body is composed of a resin composition containing titanium oxide and a transparent resin.

10. An organic EL light-emitting apparatus comprising:
the substrate according to claim 1; and
an organic EL device.

11. The substrate according to claim 1, wherein a material for forming the structural bodies has a refractive index of from 1.7 to 2.2.

12. The substrate according to claim 1, wherein the light-concentrating structural body having a hemispherical shape forms a micro-lens having a convex lens shape, and has an aspect ratio (B/A), which is obtained by the longest major axis A of the bottom face and the height B thereof, of from 0.2 to 1.5.

* * * * *